US008746666B2

(12) United States Patent
Hertel et al.

(10) Patent No.: US 8,746,666 B2
(45) Date of Patent: Jun. 10, 2014

(54) MEDIA CARRIER

(75) Inventors: Richard Hertel, Boxford, MA (US);
Julian Blake, Gloucester, MA (US);
Edward Macintosh, Amesbury, MA (US); Alexander Kontos, Lynn, MA (US); Frank Sinclair, Quincy, MA (US);
Christopher Rowland, Rockport, MA (US); Mayur Jagtap, Burlington, MA (US); Sankar Ganesh Kolappan, Tamilnadu (IN)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 186 days.

(21) Appl. No.: 13/101,280

(22) Filed: May 5, 2011

(65) Prior Publication Data

US 2012/0280442 A1    Nov. 8, 2012

(51) Int. Cl.
*B23Q 3/06*    (2006.01)

(52) U.S. Cl.
USPC ......... 269/47; 269/254 CS; 269/20; 269/903; 269/900; 269/289 R; 206/710; 206/711; 206/712; 414/935

(58) Field of Classification Search
CPC .................................................. Y10S 414/141
USPC ........ 414/935–941; 269/47, 21, 20, 903, 900, 269/289 R, 254 CS; 206/710–712, 722
IPC ................................................. H01L 21/68728
See application file for complete search history.

(56) References Cited

U.S. PATENT DOCUMENTS

| | | | |
|---|---|---|---|
| 3,977,955 A | 8/1976 | Nevis et al. | |
| 5,325,812 A | 7/1994 | Thiebaud et al. | |
| 5,391,231 A | 2/1995 | Schertler | |
| 5,501,436 A * | 3/1996 | Miller | 269/47 |
| 5,695,561 A | 12/1997 | Tomiyama et al. | |
| 6,174,011 B1 * | 1/2001 | Keigler | 294/99.1 |
| 6,228,429 B1 | 5/2001 | Bluck et al. | |
| 6,273,484 B1 * | 8/2001 | Peng | 294/86.4 |
| 6,822,730 B2 | 11/2004 | Krikhaar et al. | |
| 6,827,093 B2 * | 12/2004 | Muster et al. | 134/153 |
| 6,995,381 B2 | 2/2006 | Sheng et al. | |
| 7,234,227 B1 * | 6/2007 | Mallary | 29/603.04 |
| 7,736,436 B2 * | 6/2010 | Cadwell et al. | 117/200 |
| 2002/0192056 A1 * | 12/2002 | Reimer et al. | 414/217 |
| 2003/0057089 A1 * | 3/2003 | Nguyen | 204/298.15 |
| 2005/0103271 A1 | 5/2005 | Watanabe et al. | |
| 2007/0012586 A1 | 1/2007 | Wang | |
| 2007/0160749 A1 * | 7/2007 | Shimizu et al. | 427/131 |
| 2008/0149590 A1 | 6/2008 | Maeda et al. | |
| 2010/0025908 A1 * | 2/2010 | Munakata | 269/57 |
| 2010/0133449 A1 | 6/2010 | Takahashi | |

FOREIGN PATENT DOCUMENTS

WO    2011013648 A1    2/2011

* cited by examiner

*Primary Examiner* — Lee D Wilson
*Assistant Examiner* — Henry Hong

(57) ABSTRACT

A media carrier, adapted to hold a plurality of pieces of magnetic media, is disclosed. This media carrier can be placed on the workpiece support, or platen, allowing the magnetic media to be processed. In some embodiments, the media carrier is designed such that only one side of the magnetic media is exposed, requiring a robot or other equipment to invert each piece of media in the carrier to process the second side. In other embodiments, the media carrier is designed such that both sides of the magnetic media are exposed. In this scenario, the media carrier is inverted on the platen to allow processing of the second side.

9 Claims, 8 Drawing Sheets

MEDIA CARRIER

BACKGROUND

Magnetic media, such as that used for hard disk drives, is traditionally made by sputtering magnetic material onto an underlying substrate. As bit densities increase and the form factor of disk drives continues to decrease, there is a need to create smaller and smaller magnetic grains. It has been found that an ion implanter may be used to reduce the size of a magnetic grain on a piece of magnetic media.

An ion implanter is used to perform ion implantation or other modifications of a workpiece. A block diagram of a conventional ion implanter is shown in FIG. 1. Of course, many different ion implanters may be used. The conventional ion implanter may comprise an ion source 102 that may be biased by a power supply 101. The system may be controlled by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a workpiece or wafer 114, which is disposed on a workpiece support 116.

In operation, a workpiece handling robot (not shown) disposes the workpiece 114 on the workpiece support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the workpiece 114. After implanting ions is completed, the workpiece handling robot may remove the workpiece 114 from the workpiece support 116 and from the ion implanter 100.

Workpiece support 116 is typically made of a dimension conducive to efficiently processing wafer, specifically semiconductor wafers. In some embodiments, the workpiece support is suited for 300 mm outer diameter (OD) wafers. In addition, ion implanters are also optimized for one-sided processes, where only one surface is treated.

In contrast, magnetic media is much smaller, typically about 65 mm OD. In addition, magnetic media is treated on both top and bottom surfaces. These differences in requirements make the use of traditional ion implanters inefficient in the processing of magnetic media.

Therefore, it would be beneficial if there were an apparatus and method to processing magnetic media efficiently using ion implanters, which may have been designed primarily for semiconductor processing.

SUMMARY

A media carrier, adapted to hold a plurality of pieces of magnetic media, is disclosed. This media carrier can be placed on the workpiece support, or platen, allowing the magnetic media to be processed. In some embodiments, the media carrier is designed such that only one side of the magnetic media is exposed, requiring a robot or other equipment to invert each piece of media in the carrier to process the second side. In other embodiments, the media carrier is designed such that both sides of the magnetic media are exposed. In this scenario, the media carrier is inverted on the platen to allow processing of the second side.

DETAILED DESCRIPTION

Figure 1:
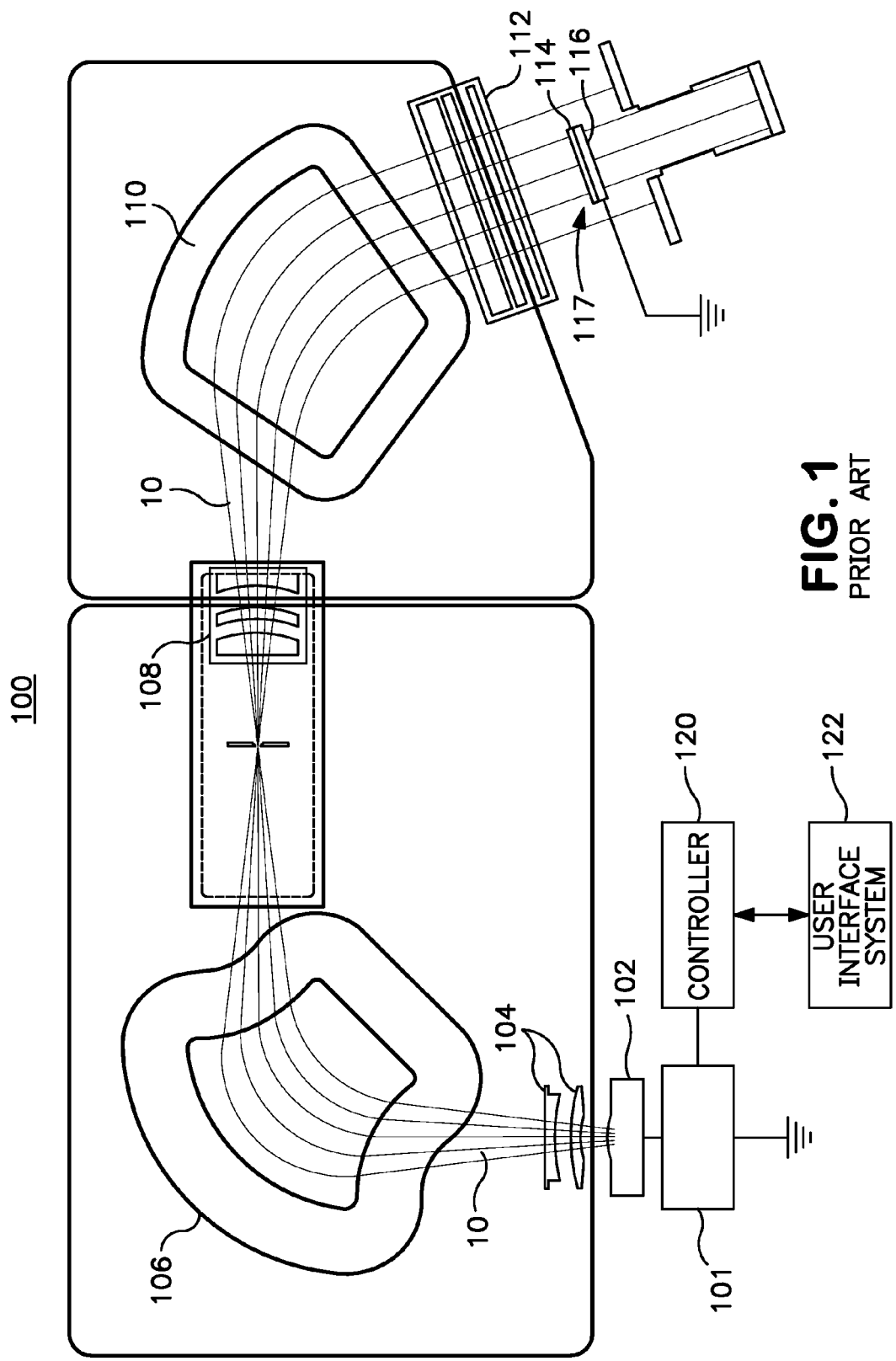
FIG. 1 is a block diagram of an ion implanter of the prior art.
Figure 2:
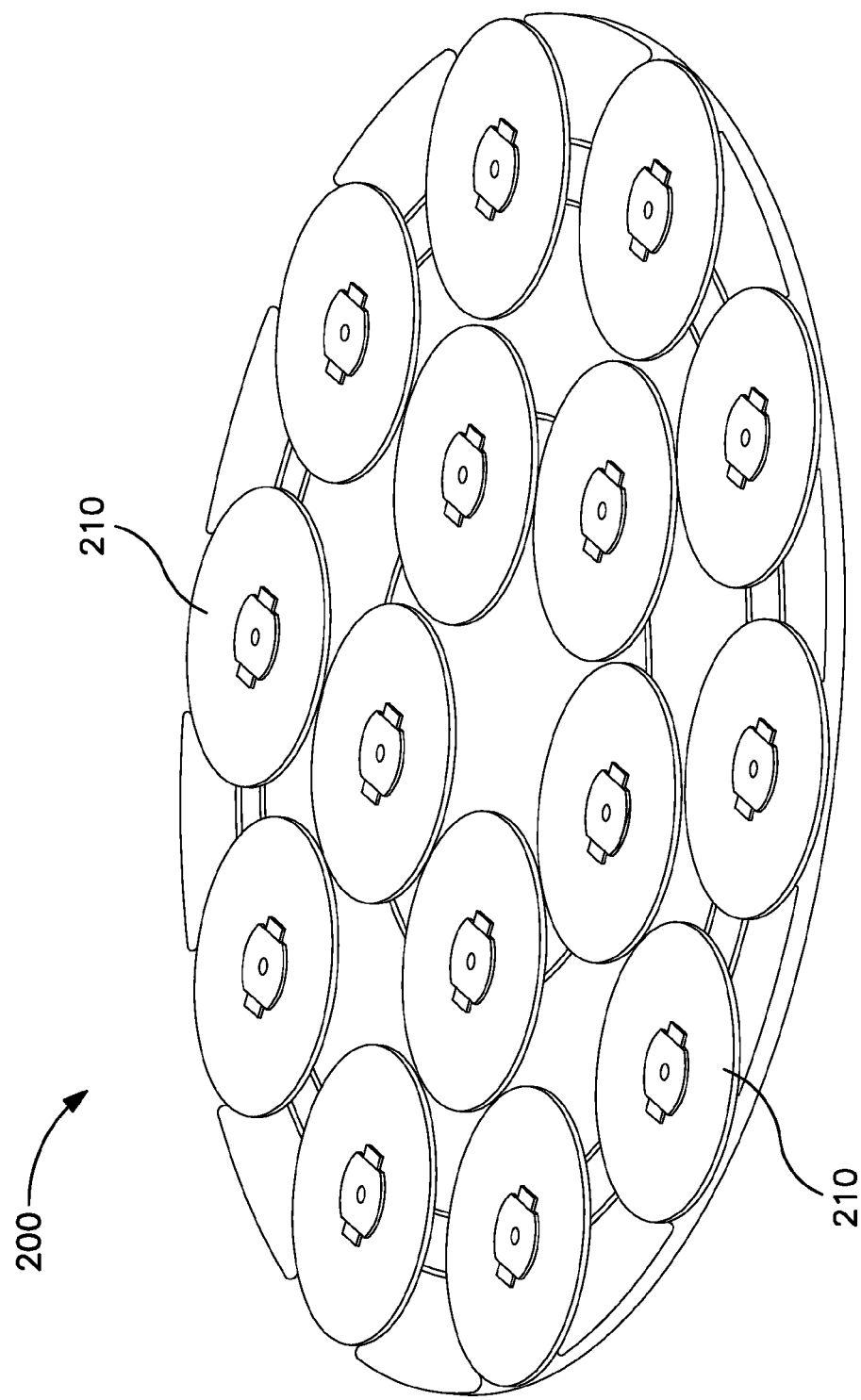
FIG. 2 is a first media carrier according to one embodiment.

FIG. 2 shows a first media carrier 200. This media carrier 200 is designed to maximize the number of pieces of media 210 that may be processing simultaneously. In this embodiment, fifteen pieces of media 210, each 65 mm in diameter and magnetic, can be arranged on a single 300 mm diameter media carrier 200. Of course, other numbers of pieces may be used and are within the scope of the disclosure. Each piece of media 210 is annular in shape, having an inner diameter and an outer diameter.

To maximize the number of media 210 that can be arranged, the media 210 are held in place by forces applied to their inner diameters. This implementation allows the pieces of media 210 to be arranged closely together, since no spacing for holding mechanisms is required along their outer diameters.

Figure 3A:
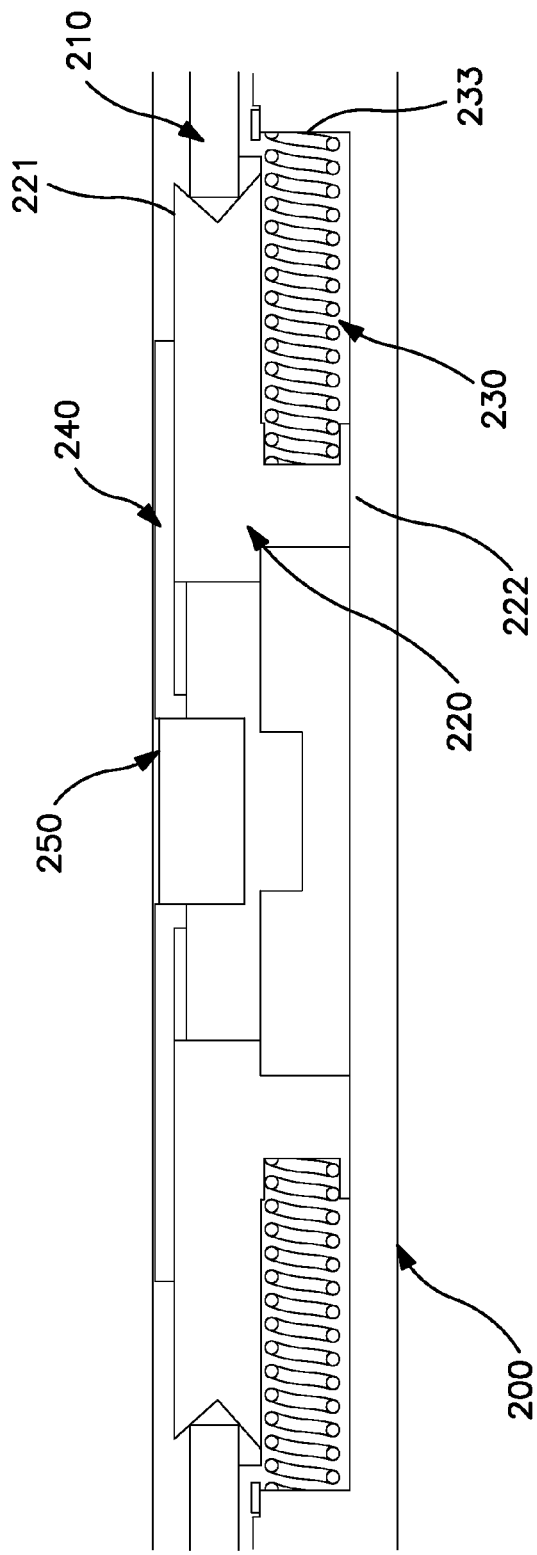
FIGS. 3A-B shows an expanded view of the holding mechanism for the media carrier of FIG. 2 according to one embodiment.
Figure 3B:
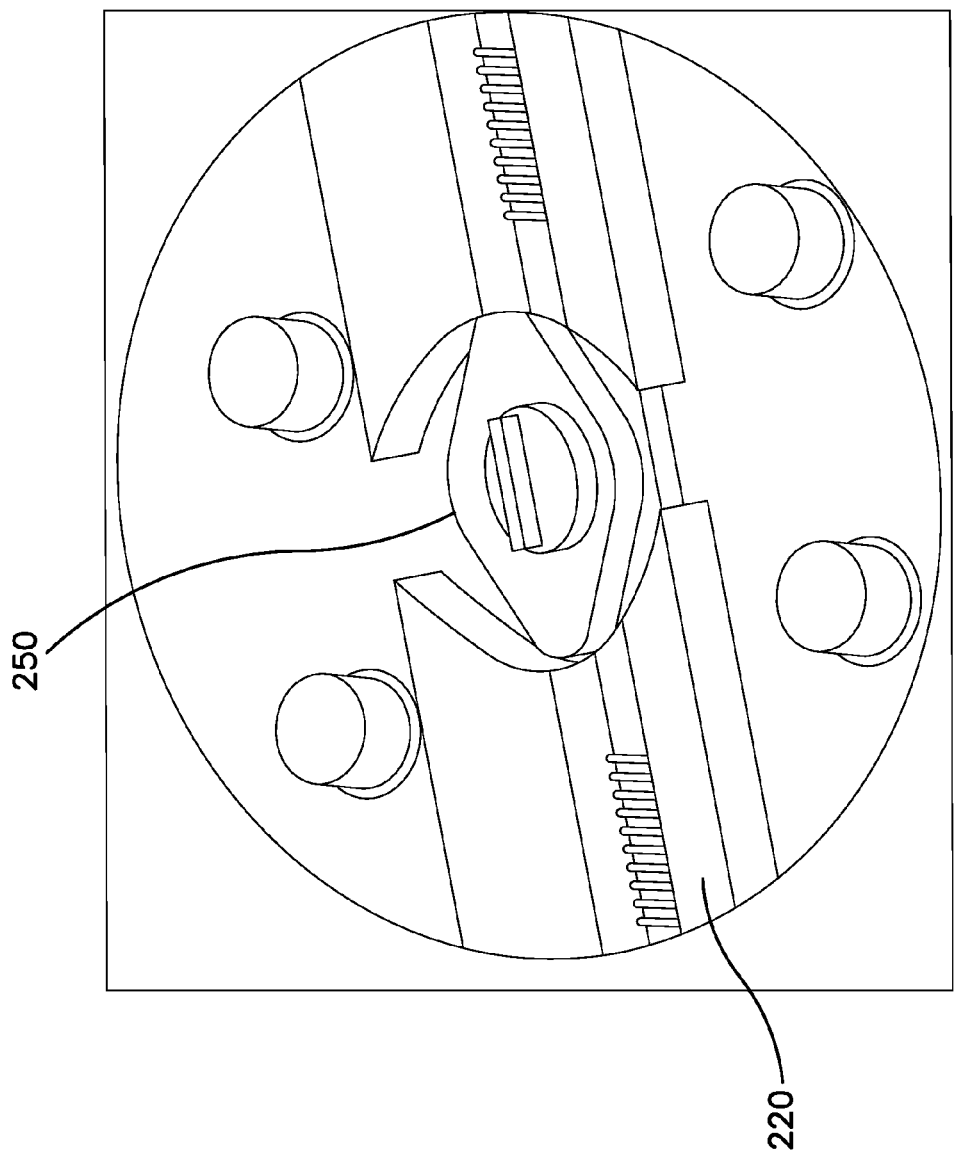

FIG. 3A shows a cross-sectional view of one media holder for the media carrier 200. In this embodiment, there are two restraint elements 220, diametrically opposed, which are used to hold the media 210 in place. In this illustration, two restraint elements 220 are shown; it should be noted that any number of restraint elements 220 may be used. The restraint element 220 includes a wafer holder with an outer edge 221, which is adapted to contact the inner diameter of the media 210. In some embodiments, this outer edge 221 is chamfered to increase the reliability of the contact. In these embodiments, the outer edge 221 is preferably designed to minimize the region of the media 210 that will be blocked from the ion beam. In some embodiments, this outer edge 221 is formed as a concave 90° angle, though other shapes or angles are possible. The restraint element 220 also has a lower stop 222. This lower stop 222 is on the side of the restraint element 220 furthest from the top surface, and is adapted to be in connection with a spring 230. The spring 230 is located in a cavity created between the lower stop 222 and an inner wall 233 of the media carrier 200. This spring 230 is therefore biased to push the wafer holder 221 away from the media 210. To counteract this force, a lock pin 250 may be employed. The lock pin 250 is an asymmetrically shaped object, with at least a locked position and an unlocked position. In the locked position, the lock pin 250 pushes against the restraint elements 220 so as to hold them against the inner diameter of the media 210. FIG. 3B shows the lock pin 250 in its locked position. By turning the lock pin 250, such as by a rotation of 90°, the lock pin 250 rotates to a position where the restraint elements 220 are able to move inwardly, thereby releasing the media 210. Returning to FIG. 3A, a cover 240 is used to protect some of the components of the restraint element 220 and lock pin 250. The lock pin 250 may be rotated by various means. In some embodiments, the lock pin 250 is rotated manually, such as by use of a screwdriver. In another embodiment, a robot may rotate the lock pin 250 prior to removing or inverting the media 210.

Although FIG. 3A shows the spring 230 contacting a lower stop 222 in the restraint element 220, the disclosure is not limited to this embodiment. In another embodiment, the spring 230 is located in a channel within the restraint element 220. In both embodiments, the spring 230 is compressed between the restraint element 220 and the media carrier 200 where the spring is biased to move the restraint element 220 inwardly.

Figure 4A:
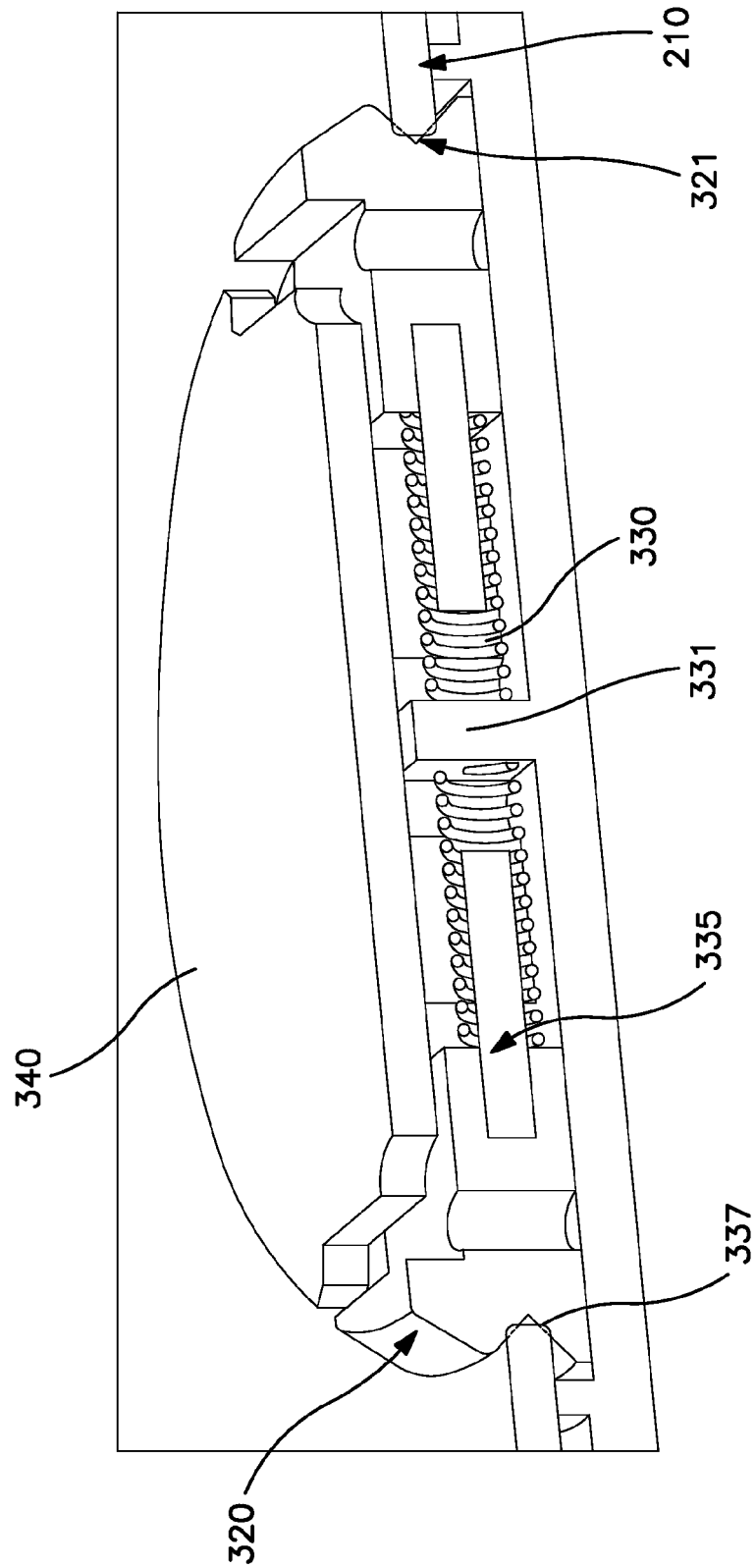
FIGS. 4A-B shows an expanded view of the holding mechanism for the media carrier of FIG. 2 according to a second embodiment.

FIG. 4A shows a cross-section of one media holder in a second embodiment of the media carrier 300, where the spring 330 is oriented so as to bias the restraint element 320 toward the media 210. In this embodiment, the carrier 300 has a support 331 located at or near the center of the opening for the media 210. This support 331 serves as the fixed point against which the spring 330 is compressed. In this embodiment, the spring 330 pushes against an inner edge of the restraint element 320, so as to push the wafer holder 337 toward the media 210. In some embodiments, a pin dowel 332 is used to guide the spring 330. As was described above, the wafer holder 337 has a chamfered outer edge 321, which presses against the media 210.

Figure 4B:
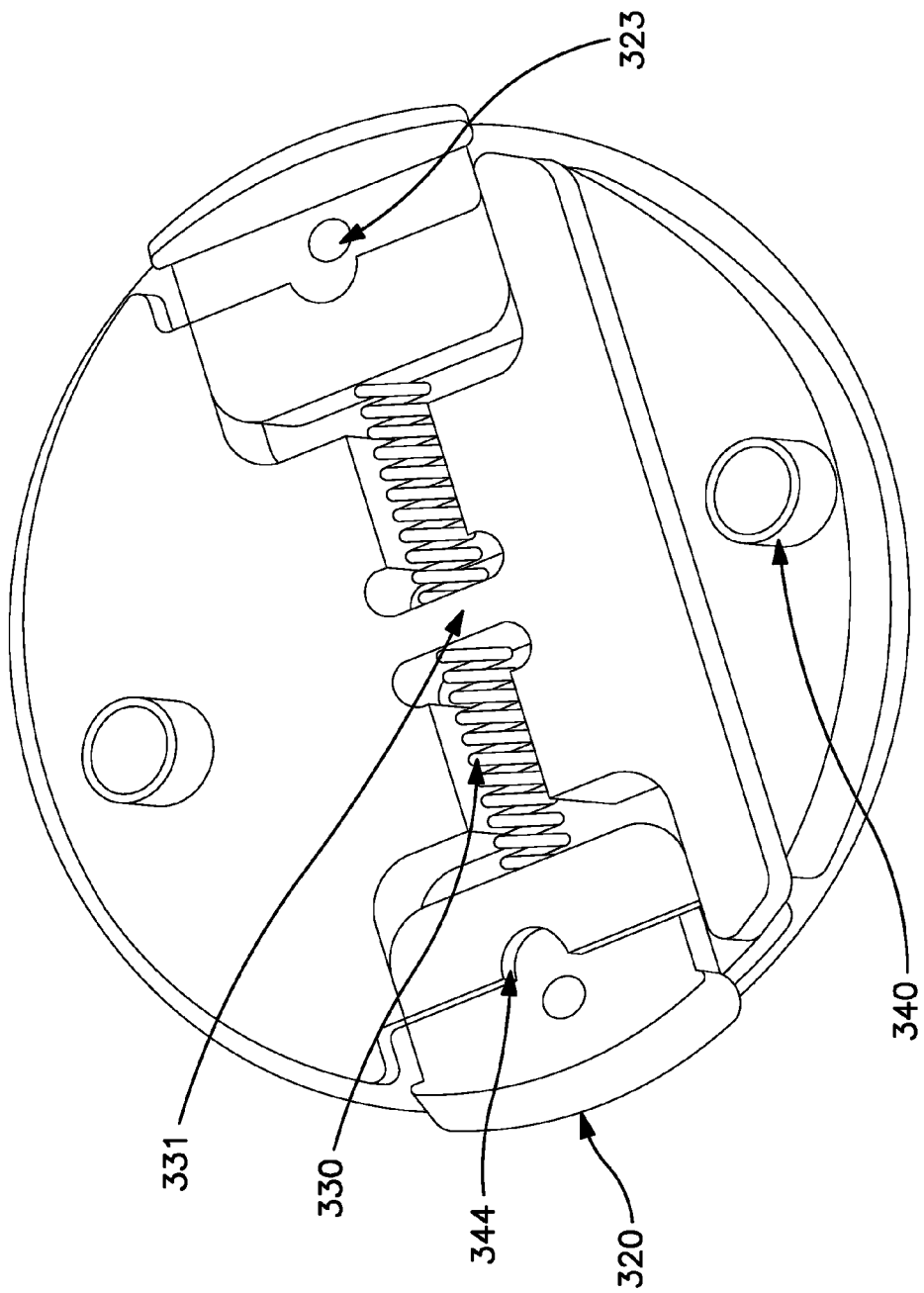

FIG. 4B shows a top view of the media holder of FIG. 4A. In order to release the media 210, it is necessary to retract the restraint elements 320 from the media 210. In one embodiment, a hole or opening 323 exists in the top side of the restraint element 320. An operator or a robot can insert a tool into the two holes 323 and by moving them toward one another, release the media 210 from the carrier 300. In some embodiments, a cover 340 is placed over the center opening in the media carrier 300 to protect the components that are beneath it. This cover 340 may have an indentation 344 along its outer edge near the wafer holder 337, so that the tool used to retract the restraint element 320 can operate without removing the cover 340.

In the embodiments of FIGS. 3A-B and 4A-B, the media carrier 200, 300 may be about 4 mm in total thickness, although other thicknesses are possible. It should also be noted that in these embodiments, the media 210 must be removed from the media carrier 200, 300 in order to process its opposite side. Thus, to process a plurality of pieces of media 210, each is loaded into the media carrier 200, 300 and subjected to the ion implantation process. After the first side has been completed, the media carrier 200, 300 is removed from the platen and the operator (or robot) must invert each piece of media 210 individually and reload them into the media carrier 200, 300. The media carrier 200, 300 is then returned to the platen and the second side of the media 210 can then be processed.

In addition, the embodiments shown in FIGS. 3 and 4 show two active restraint elements. In other words, in each figure both restraint elements 220, 320 are capable of movement and provide force holding the media 210 in place. In other embodiments, one restraint element may be passive or stationary, while the other restraint element is movable. In such an embodiment, there may be only one spring or biasing element 230, 330 per media opening.

Figure 5:
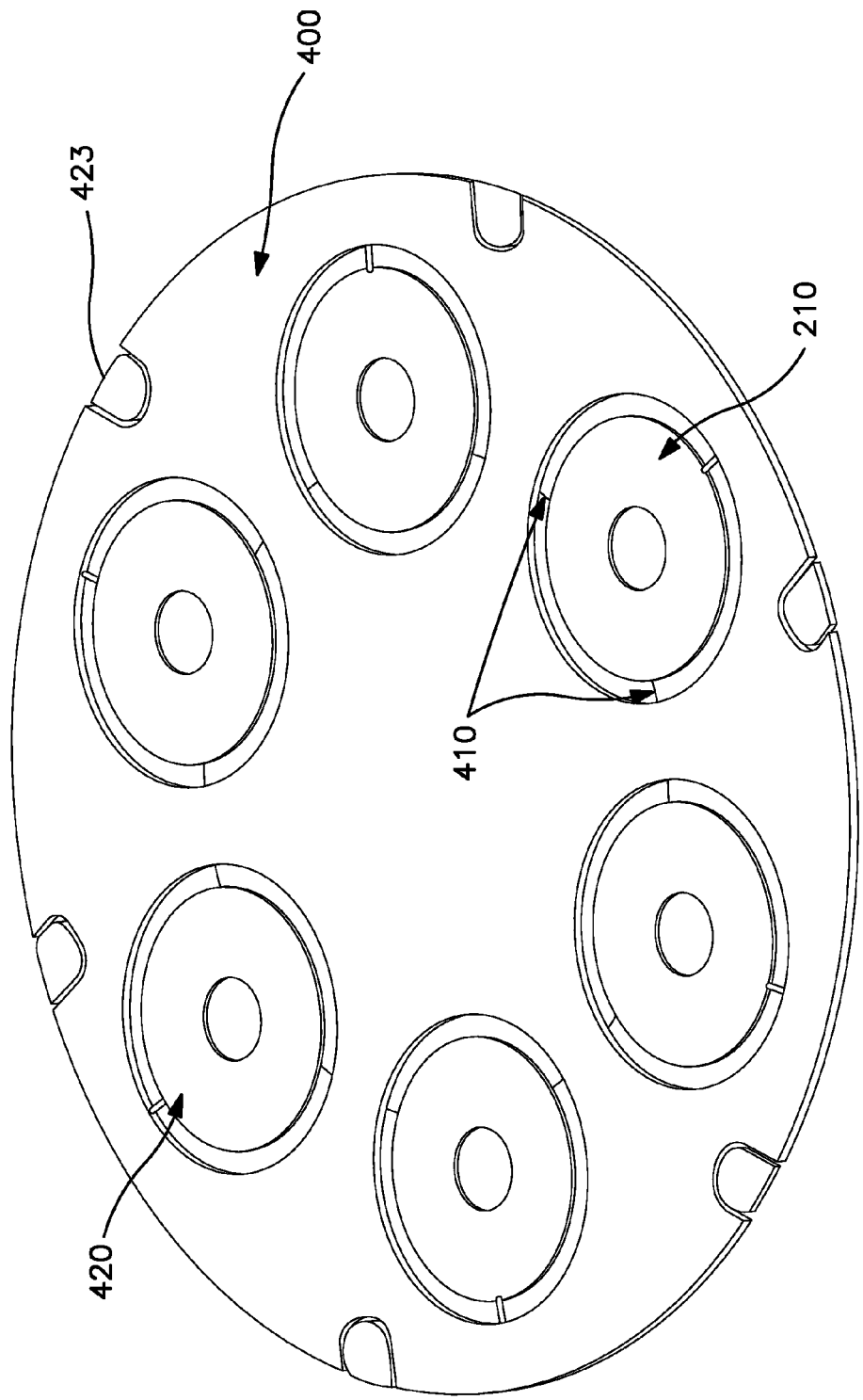
FIG. 5 is a second media carrier where both sides of the media are exposed.
Figure 6:
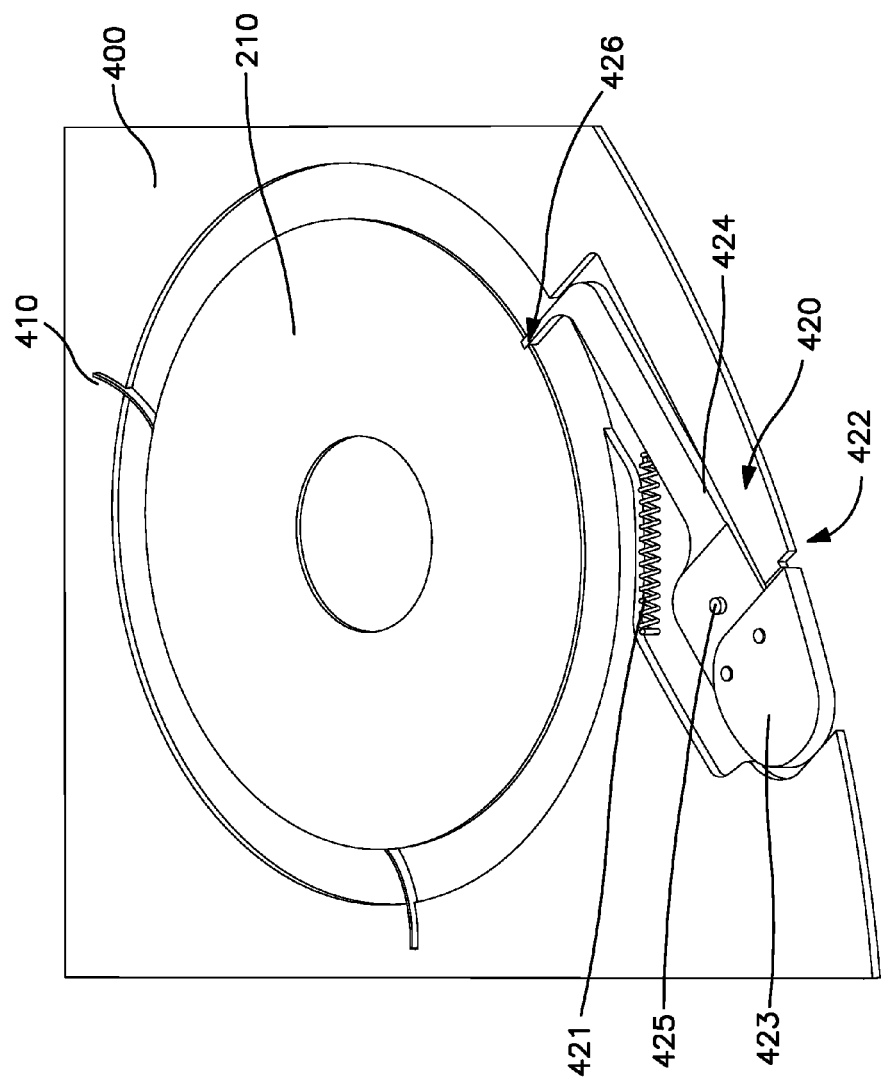
FIG. 6 shows an expanded view of the holding mechanism for the media carrier of FIG. 5 according to one embodiment.

FIG. 5 shows a second media carrier 400, in which the media 210 does not need to be removed from the carrier 400 during processing. Unlike carriers 200, 300, this embodiment holds the media 210 in place by applying force on the outer diameter of the media 210. Since the holding mechanisms are on the outside of the pieces of media 210, both surfaces of the media can be exposed, without any shadowing from the media carrier 400. In the embodiment shown in FIG. 5, six pieces of media 210 can be processed at one time. The disclosure is not limited to this number, as greater or smaller numbers of media 210 may be processed simultaneously. Each opening in the media carrier 400 is adapted to hold a piece of media 210, such as one having an outer diameter of 65 mm. The outer diameter of the media carrier 400 is about 300 mm, although other dimensions can be used. Each opening has a plurality of passive restraining elements 410. These passive restraining elements 410 may be springs, or malleable metal bars. Other passive restraints may also be used. Each opening has at least one active restraint element 420. FIG. 6 shows an expanded view of a single opening in the media carrier 400. The active restraint element 420 may be made up of a biasing member 421, which urges the wafer holder 426 against the media 210, and an actuator 422, which is used to overcome the bias force of biasing member 421. In some embodiments, the actuator 422 is manually operated, as is shown in FIG. 6. In this embodiment, the operator (or robot) presses the button 423 inwardly. This causes the arm 424 to pivot about pivot point 425, thereby overcoming the force of biasing member 421 and releasing the wafer holder 426 away from the media 210.

In the embodiment shown in FIG. 5, the buttons 423 are arranged along the outer diameter of the media carrier 400 to simplify the process of releasing the media 210 from the carrier 400. In other embodiments, some or all of the buttons 423 may not be along the outer diameter.

FIG. 5 shows a double sided carrier 400, where the media 210 can be processed on both sides without being removed from the carrier 400. However, in some embodiments, the media carrier 400 may be single sided, in that the opposite side of the media carrier obscures some or all of the media 210. In these cases, the individual pieces of media must be inverted in the carrier 400, as described with respect to media carriers 200, 300 above.

The media carrier 400 of FIGS. 5-6 allows efficient processing of multiple pieces of media 210. To process media, the following steps may be taken. First, the pieces of media 210 are loaded into the media carrier 400. This may be performed by actuating the actuator 422 so that the active restraint is moved radially outward. The media 210 is then placed in the opening. In some embodiments, a tool is used to hold the inner diameter of the media 210. The media 210 is then glided into the opening, and then pressed toward the passive restraints. The active restraint element 420 is then released, and the wafer holder 426 holds the media 210 in place. The media carrier 400 is then placed on the platen, and the first surfaces of the media 210 can be processed by the ion implantation equipment. After the first surface has been processed, the media carrier 400 can be inverted, without removing the media 210, and placed on the platen again. The second surface of the media 210 can then be processed by the ion implantation equipment. After both sides have been processed, the carrier 400 is removed from the platen and all of the pieces of media 210 are replaced from the media carrier 400.

Many of the components, such as the media carrier 200, 300, 400 and the restraint elements 410, 420 are subjected to the ion beam during the processing of the media 210. As such, in each of the embodiments described above, the media carrier 200, 300, 400 may be chosen from the group of materials, which, when exposed to an ion beam, contribute no undesirable contamination due to atomic sputtering or particulation. Materials such as graphite, silicon carbide, silicon, metals coated with silicon (either by PECVD or flame spraying), quartz, and polymers, such as polyether ether ketone (PEEK), polyimide-based plastics such as Dupont Vespel® and Duport Kapton® may be utilized. In certain embodiments, stainless steel and aluminum may also be utilized.

Similarly, the materials used by exposed spring elements, such as restraint elements 410, 420, must also contribute no undesirable contamination. In addition, these components must maintain their spring constant (elastic modulus) when heating from exposure to an ion beam. High temperature spring materials are well known, such as chromium-based superalloys, such as Inconel®, however metal contamination from these alloys may be undesirable. Other materials that may be employed include quartz, silicon, and graphite.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An apparatus adapted to hold a plurality of pieces of media, each of said pieces of media having an inner diameter and an outer diameter, said apparatus used in conjunction with ion implantation equipment, comprising:
    a carrier, having a first diameter and a plurality of openings of a second diameter, smaller than said first diameter, each opening passing through said carrier and adapted to hold a piece of media such that two surfaces of said piece of media are exposed;
    a plurality of passive restraint elements, each associated with one of said openings and disposed along an outer edge of said associated opening, wherein each of said plurality of passive restraint elements is configured to hold a piece of media in said associated opening; and
    a plurality of active restraint elements, each associated with one of said openings and disposed along said outer edge of said associated opening and operating in conjunction with at least one of said plurality of passive restraint elements, each of said active restraint elements having a first position wherein said piece of media is held in said associated opening, and a second position wherein said piece of media is released from said associated opening, each active restraint element comprising:
    a wafer holder;
    a biasing element biased to hold said wafer holder against said piece of media in said first position; and
    a manual actuator disposed on an outer edge of said carrier, wherein actuation of said manual actuator causes said wafer holder to move to said second position so as to release said piece of media from said associated opening, wherein said plurality of active restraint elements operate independently from one another.

2. The apparatus of claim 1, wherein each of said plurality of said passive restraint elements and said active restraint elements are adapted to hold said pieces of media at said outer diameter.

3. An apparatus adapted to hold a plurality of pieces of media, each of said pieces of media having an inner diameter and an outer diameter, said apparatus used in conjunction with ion implantation equipment, comprising:
    a carrier, having a first diameter and comprising a plurality of media holders, wherein each of said media holders comprises:
        an opening which passes through said carrier;
        a plurality of passive restraint elements, wherein each of said plurality of restraint elements is configured to hold a piece of media in said opening along its outer diameter, such that two sides of said piece of media are exposed; and
        an active restraint element, operating in conjunction with said passive restraint elements, said active restraint element having a first position wherein said piece of media is held in said opening along its outer diameter, and a second position wherein said piece of media is released from said opening, wherein said active restraint element comprises:
        a wafer holder;
        a biasing element biased to hold said wafer holder against said piece of media in said first position; and
        a manual actuator disposed along an outer edge of said carrier, wherein actuation of said actuator causes said wafer holder to move to said second position so as to release said piece of media from said opening,
    wherein each of said plurality of media holders operate independently from one another.

4. The apparatus of claim 1, wherein said manual actuator comprises a button and wherein said wafer holder is attached to an arm, rotatably about a pivot point, wherein actuation of said button causes said arm to rotate about said pivot point, whereby moving said wafer holder to said second position.

5. The apparatus of claim 4, wherein said actuation of said button comprises pressing said button inward toward a center of said media carrier.

6. The apparatus of claim 3, wherein said manual actuator comprises a button and wherein said wafer holder is attached to an arm, rotatably about a pivot point, wherein actuation of said button causes said arm to rotate about said pivot point, whereby moving said wafer holder to said second position.

7. The apparatus of claim 6, wherein said actuation of said button comprises pressing said button inward toward a center of said media carrier.

8. The apparatus of claim 1, wherein said carrier comprises a cover, said cover used to protect parts of said active restraint element from ions emitted from said ion implantation equipment.

9. The apparatus of claim 3, wherein said carrier comprises a cover, said cover used to protect parts of said active restraint element from ions emitted from said ion implantation equipment.

* * * * *